(12) United States Patent
Hui et al.

(10) Patent No.: US 8,309,444 B2
(45) Date of Patent: Nov. 13, 2012

(54) SYSTEM AND METHOD OF DOSAGE PROFILE CONTROL

(75) Inventors: Keung Hui, Hsin-Chu (TW); Chun-Lin Chang, Jhubei (TW); Jong-I Mou, Hsinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 189 days.

(21) Appl. No.: 12/831,699

(22) Filed: Jul. 7, 2010

(65) Prior Publication Data

US 2012/0009692 A1    Jan. 12, 2012

(51) Int. Cl.
*H01L 21/425* (2006.01)

(52) U.S. Cl. ..... 438/514; 438/535; 438/527; 250/491.1; 250/492.2; 250/397; 257/E21.147

(58) Field of Classification Search ............... 250/491.1, 250/491.2, 397–398, 492.21; 438/535, 510–520, 438/527, 914, 951; 257/E21.147
See application file for complete search history.

(56) References Cited

U.S. PATENT DOCUMENTS

| | | | |
|---|---|---|---|
| 4,929,840 A | 5/1990 | Dykstra et al. | |
| 6,207,964 B1 | 3/2001 | McIntyre et al. | |

*Primary Examiner* — Kimberly Rizkallah
*Assistant Examiner* — Mark A Laurenzi
(74) *Attorney, Agent, or Firm* — Slater & Matsil, L.L.P.

(57) ABSTRACT

A system and method for controlling a dosage profile is disclosed. An embodiment comprises separating a wafer into components of a grid array and assigning each of the grid components a desired dosage profile based upon a test to compensate for topology differences between different regions of the wafer. The desired dosages are decomposed into directional dosage components and the directional dosage components are translated into scanning velocities of the ion beam for an ion implanter. The velocities may be fed into an ion implanter to control the wafer-to-beam velocities and, thereby, control the implantation.

16 Claims, 7 Drawing Sheets

FIG. 4

| track | 1 | 2 | 3 | 4 | 5 | 6 | 7 | 8 | 9 | 10 |
|---|---|---|---|---|---|---|---|---|---|---|
| u | 2.96 | 2.94 | 2.94 | 2.77 | 2.75 | 2.96 | 2.96 | 2.96 | 2.96 | 2.96 |
| v | 3.17 | 2.77 | 3.09 | 2.71 | 2.72 | 2.93 | 2.93 | 2.93 | 2.93 | 2.93 |

| track | 11 | 12 | 13 | 14 | 15 | 16 | 17 | 18 | 19 |
|---|---|---|---|---|---|---|---|---|---|
| u | 2.96 | 2.96 | 2.63 | 2.82 | 2.73 | 2.84 | 3.27 | 3.11 | 2.96 |
| v | 2.93 | 2.93 | 2.90 | 2.78 | 2.86 | 2.81 | 3.04 | 2.97 | 2.92 |

FIG. 5B

SYSTEM AND METHOD OF DOSAGE PROFILE CONTROL

TECHNICAL FIELD

The present embodiments relate generally to a system and method for implanting ions and, more particularly, to a system and method for controlling the dosage of ion implants during semiconductor manufacturing.

BACKGROUND

Generally, implanting dopants is a critical process step in the manufacturing of semiconductor devices that gives manufacturers a controlled method of changing the electrical characteristics of chosen regions within the semiconductor device. A typical ion implantation process uses an ion implanter to initially generate ions of the desired dopant and then accelerates these ions to an appropriate energy level. Once accelerated, the ion implanter then transports the ions along an ion beam to impact and implant into a semiconductor wafer.

However, because the ion beam does not typically cover the entire wafer at once, the illumination of the wafer by the ion beam is controlled by a wafer-manipulator which sweeps the wafer at constant speed across the ion beam which is anchored at a fixed position. These sweeps generally include a constant velocity implant with a number of back-and-forth motions separated by incremental advancements of the wafer occurring between each motion in one direction. Once the advancements have completed in one direction, the wafer is rotated (typically 90°) and another set of incremental passes are used with the wafer being advanced in a second direction relative to the ion beam. This causes any single point of the wafer to be included in multiple sweeps (from the first increment in which the ion beam illuminates the point and including each increment until the ion beam moves past the point), with the total ion concentration determined from the accumulation of ion implantations during each pass of the overlapping scans.

However, using a constant velocity implant that is controlled by a two-dimensional wafer manipulator (by performing one pass and then rotating the wafer for another pass of incremental implants) only allows for a two-dimensional control of the implantation process. This simple, two-dimensional motion control also fails to take into account the three dimensional topology of the wafer itself, which can adversely vary the doping profile of the wafer. Without such three dimensional control, the typical two-dimensional ion implanter cannot obtain a uniform functionality of the resultant semiconductor devices (e.g., drain-current vs. voltage characteristics, clock speeds, leakage currents, etc.) because it cannot take into account this third dimension.

What is needed is an ion implanter that can take into account variations in the topography of a wafer in order to obtain a uniform functionality across the wafer.

SUMMARY

These and other problems are generally solved or circumvented, and technical advantages are generally achieved, by embodiments which implant ions in to semiconductor wafers.

In accordance with embodiments, a method for manufacturing semiconductor devices comprises providing a semiconductor wafer and separating the semiconductor wafer into at least a first cell and a second cell. The first cell is assigned a first dosage and the second cell is assigned a second dosage. The first dosage is decomposed into a first dimension component and a second dimension component. The second dosage is decomposed into a third dimension component and a fourth dimension component. The first dimension component is converted into a first velocity, the second dimension component is converted into a second velocity, the third dimension component is converted into a third velocity, and the fourth dimension component is converted into a fourth velocity. Dopants are implanted into the first cell using the first velocity and the second velocity, the dopants being implanted with an ion implanter. Dopants are implanted into the second cell using the third velocity and the fourth velocity, the dopants being implanted with the ion implanter. The first dosage and the second dosage may or may not be the same value.

In accordance with another embodiment, a method for implanting dopants comprises providing a substrate and separating the substrate into a plurality of cells. A dosage is determined for each one of the plurality of cells. The dosage for each one of the plurality of cells is decomposed into directional components. The directional components are translated into directional velocities for each one of the plurality of cells, the translating the directional components using at least one conversion factor. The directional velocities are applied to a substrate control system, and ions are implanted into the plurality of cells as the substrate and an ion beam move relative to each other at the directional velocities for each respective cell into which the ion beam is implanting ions.

In accordance with another embodiment, a system for implanting dopants into a semiconductor wafer comprises an ion beam generator, a wafer holder for holding a wafer, a wafer positioning system able to adjust the position of the wafer holder along a first direction and a second direction, and a wafer positioning control system communicably coupled to the wafer positioning system, the wafer positioning control system comprising a storage element for storing a first velocity for a first cell of the wafer and a second velocity for a second cell of the wafer.

An advantage of an embodiment is that it allows for fine tuning of the implantation of dopants into semiconductor wafer. This allows the topology of the wafer to be accounted for and allows the dopant profile to be matched to the desired uniformity of the final electrical performances more evenly across the wafer.

BRIEF DESCRIPTION OF THE DRAWINGS

For a more complete understanding of embodiments, and the advantages thereof, reference is now made to the following descriptions taken in conjunction with the accompanying drawings, in which:

FIG. 4 illustrates a wafer that has been separated into a grid of individual regions in accordance with an embodiment;

FIGS. 5A-5B illustrate resultant track velocities and their profiles using the method of the present embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of embodiments are discussed in detail below. It should be appreciated, however, that the embodiments discussed herein provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely an ion implantation device that modifies the velocity of the ion implantation in order to achieve a greater uniformity of the final electrical performances of devices across a wafer. These embodiments may also be applied, however, to other implantation processes.

Figure 1:
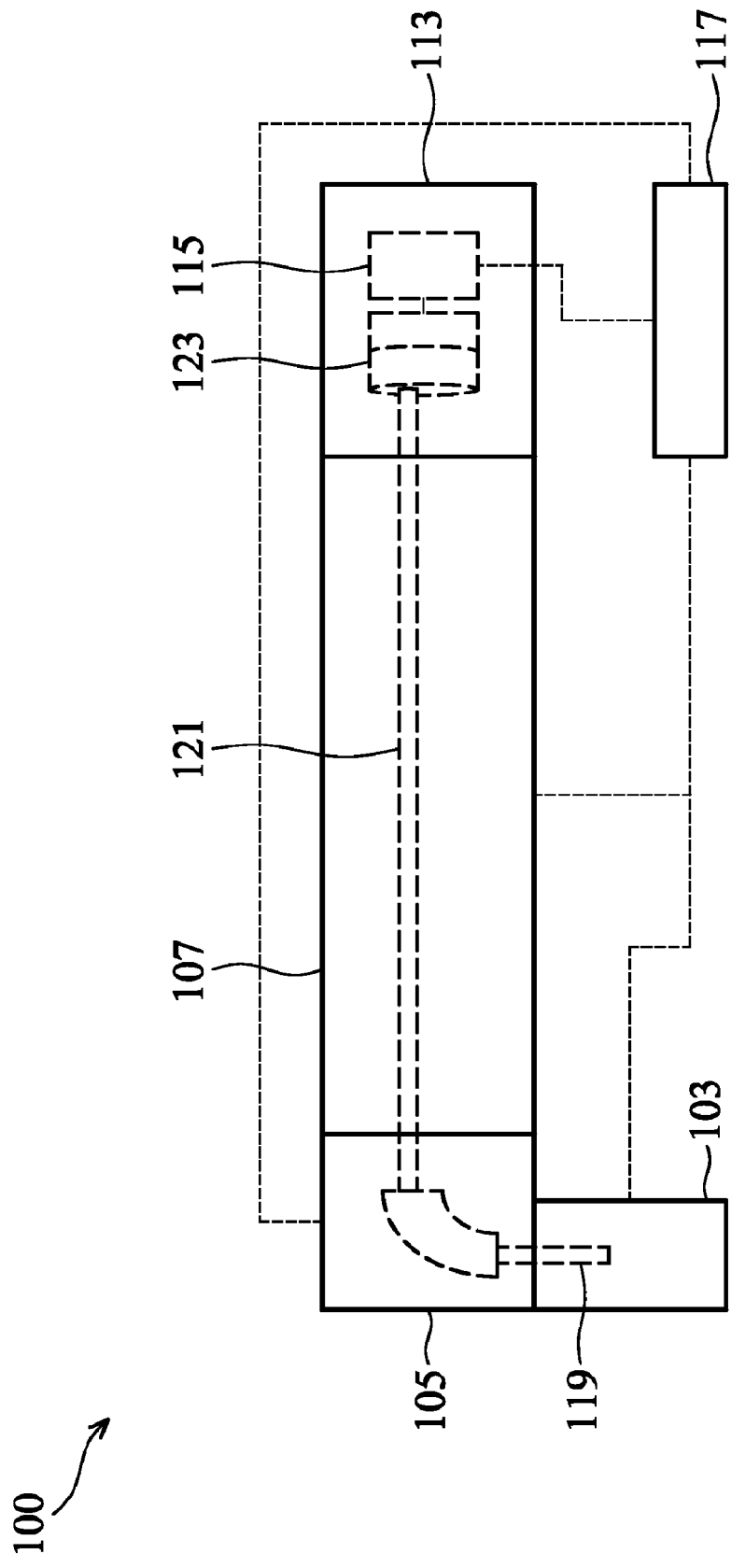
FIG. 1 illustrates an ion implanter in accordance with an embodiment.

With reference now to FIG. 1, there is shown an ion implanter 100 with which embodiments may be used. As illustrated, the ion implanter 100 may include an ion source 103, a mass analysis magnet 105, a linear accelerator 107, an end station 113, a wafer handling unit 115 and a controller 117 to control the operation of the ion implanter 100. Each of these pieces will be discussed in the following paragraphs.

The ion source 103 produces an ion beam 119. However, as the ion source 103 produces ions having a range of charge-to-mass ratio, and only a certain range of ions are suitable for implantation, the ion beam 119 is directed towards the mass analysis magnet 105 in order to electromagnetically separate those ions having a desired charge-to-mass ratio for implantation from those ions having an undesired charge-to-mass ratio. Once a coherent ion beam 121 of suitable charge-to-mass ratio is obtained, the coherent ion beam 121 is sent to the linear accelerator 107.

The linear accelerator 107 is used to impart additional energy to the coherent ion beam 121 as it passes through the linear accelerator 107. The linear accelerator 107 imparts this additional energy using a series of electrodes (not shown) that generate an electromagnetic field which, when the coherent ion beam 121 passes through the field, works to accelerate the coherent ion beam 121. The linear accelerator 107 may vary the electromagnetic fields periodically with time or may adjust the phase of the electromagnetic fields to accommodate ions with different atomic numbers as well as ions having different initial speeds.

Once accelerated, the coherent ion beam 121 is directed towards the end station 113. The end station 113 may house the wafer handling unit 115, which handles a wafer 123 which will be implanted with ions from the coherent ion beam 121. The wafer handling unit 115 is utilized to move the wafer 123 in relation to the coherent ion beam 121 so as to illuminate different sections of the wafer 123 with the coherent ion beam 121. For example, the wafer handling unit 115 may comprise two motors (not shown) which may be used to control the position of the wafer 123 in at least two directions, such as an x-direction and a y-direction, relative to the coherent ion beam 121.

However, as one of ordinary skill in the art will recognize, moving the wafer 123 in relation to the coherent ion beam 121 is merely one exemplary method of illuminating different sections of the wafer 123 with the coherent ion beam 121. Other suitable methods, such as the use of deflection electrodes along the path of the coherent ion beam 121 to shift the direction of the coherent ion beam 121 in relation to the wafer 123 instead of shifting the wafer 123 in relation to the coherent ion beam 121, using a multiple wafer rotating system to illuminate multiple wafers in order, or using angular implantation methods, may also be utilized. These methods, and any other suitable method for illuminating different portions of the wafer 123 with the coherent ion beam 121, are fully intended to be included within the scope of the present disclosure.

The controller 117 is used to control the operating parameters of the ion implanter 100 during operation. The controller 117 may be implemented in either hardware or software, and the parameters may be hardcoded or fed into the controller 117 through an input port. The controller 117 may be used to store and control parameters associated with the operation of the ion implanter 100, such as the desired ion beam current, the current to the accelerator electrodes, and the like. Additionally, the controller 117 may also be used to control the wafer handling unit 115 and, more specifically, the velocity of the motors of the wafer handling unit 115, which, in turn, control the velocity of the wafer 123 with respect to the coherent ion beam 121.

Figure 2:
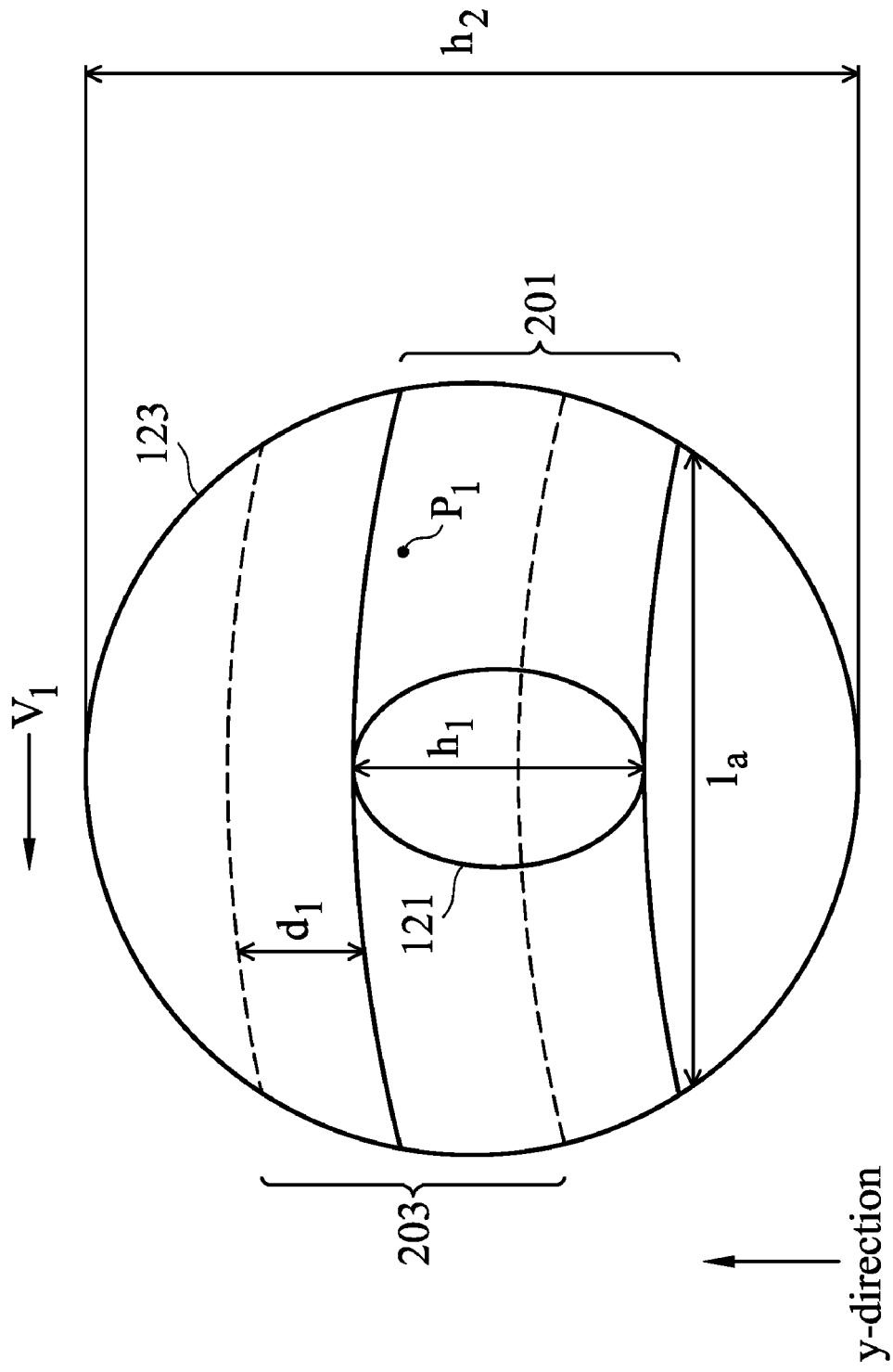
FIG. 2 illustrates an ion beam as it is illuminating a wafer in accordance with an embodiment.

FIG. 2 illustrates the coherent ion beam 121 as it is illuminating the wafer 123 while the wafer 123 is being moved relative to the coherent ion beam 121. As illustrated, because the coherent ion beam 121 has a height $h_1$ less than a height $h_2$ of the wafer 123, the wafer 123 is swept beneath the coherent ion beam 121 at a first velocity $v_1$ to illuminate a first track 201 of the wafer 123, where the first track 201 has the same height $h_1$ as the coherent ion beam 121. When the coherent ion beam 121 has completed the first track 201, completing an arc length $l_a$, the position of the wafer 123 with respect to the coherent ion beam 121 is adjusted along a first direction, such as a y-direction, a distance $d_1$ such as between about 1 cm and about 3 cm. Once adjusted, the coherent ion beam 121 is swept back along a second track 203 to illuminate a different section of the wafer 123. The second track 203 may overlap portions of the first track 201 so that a point $P_1$ within the wafer 123 may be exposed to the coherent ion beam 121 multiple times before all of the tracks are completed, or the second track 203 may be aligned with the first track 201 so as to illuminate a different section of the wafer 123 without any overlap. The movement of the wafer 123 relative to the coherent ion beam 121 as the first track 201 is being formed may be controlled by motors (not shown) located on the wafer handling system 115 (see FIG. 1). The speed of these motors and, therefore, the velocity of the wafer 123 as it moves relative to the coherent ion beam 121, may be controlled by the controller 117. Additionally, the controller 117 may be used to dynamically adjust the velocity of the wafer 123 relative to the coherent ion beam 121 during the passage of the first track 201 and subsequent tracks. This allows for a greater control of the dosages by controlling the implantation process. The derivation of the track velocities is described below with respect to FIG. 3.

The illuminations of the wafer 123 by the incremental track adjustments may be continued until all of the desired portions of the wafer 123 (e.g., the entire wafer 123) have been illuminated. Once all of the tracks (e.g., the first track 201, the second track 203, etc.) in a certain direction have been completed, the position of the wafer 123 may be rotated 90° and implantation along a second set of tracks may be performed along a second direction (relative to the wafer 123), such as an x-direction. This pattern of tracking along two separate directions helps to even out fluctuations that may occur if only a single direction is utilized, and also broadens the capabilities of the ion implanter 100 by allowing for another variable in the implantation process.

Figure 3:
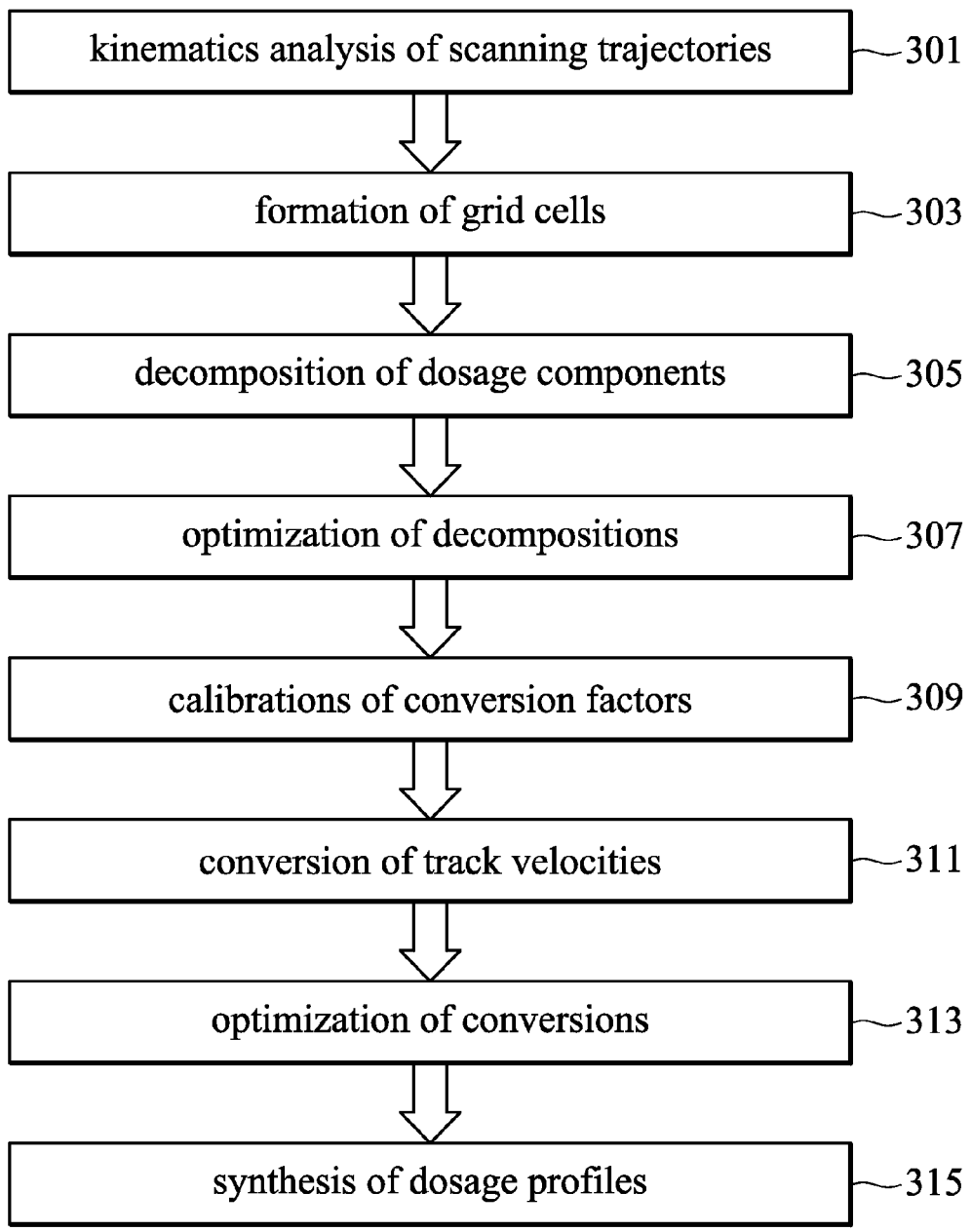
FIG. 3 illustrates a method of determining track velocity parameters for an ion implanter in accordance with an embodiment.

FIG. 3 illustrates a method for adjusting the implantation parameters in order to achieve a greater uniformity of the final electrical performances of devices across the wafer 123. This method involves, as step 301, performing a kinematic analysis of the ion implanter 100 to determine its physical operating characteristics. A wafer 123 to be implanted is separated into a series of grid cells in step 303 and each of the cells are assigned a desired dosage. The dosage components are decomposed into directional components in step 305 and then optimized in step 307. Conversion factors for the ion implanter 100 are calibrated in step 309 and then used to convert directional components into track velocities in step 311. The track velocities are optimized in step 313, and the optimized track velocities are synthesized in step 315. Each of these method steps will be discussed separately in the following paragraphs.

Step 301 of the method involves performing a kinematic analysis of the scanning trajectory of the ion implanter 100 (see FIGS. 1 and 2). This analysis may be performed to determine the unique, machine specific parameters for use in further calculations (described below with respect to Equations 3 and 4). This kinematic analysis may be performed using an empirical analysis of the motion of the wafer 123 with respect to the coherent ion beam 121, and may be used to determine such parameters as the ion beam current intensity $J_0$, the number of tracks along the beam height k, the arc length $l_a$ of trajectory over the coherent ion beam 121 width, the number of tracks m along particular directions (such as the x-direction), the height $h_1$ of the coherent ion beam 121, the distance $d_1$ of the incremental advances that may be performed by the ion implanter 100, the critical dimension achievable line width, and the like. By way of example only, the ion implanter 100 for use in embodiments may have an ion beam intensity of less than about 15 mA, such as about 12 mA; between about 1 and about 10 tracks along the beam height (the number of tracks that would illuminate a single point $P_1$), such as about 7; an arc length of trajectory over the coherent ion beam 121 width of less than about 450 mm, such as about 300 mm; and between about 10 and about 30 tracks along the vertical lift, such as about 19.

Figure 4:
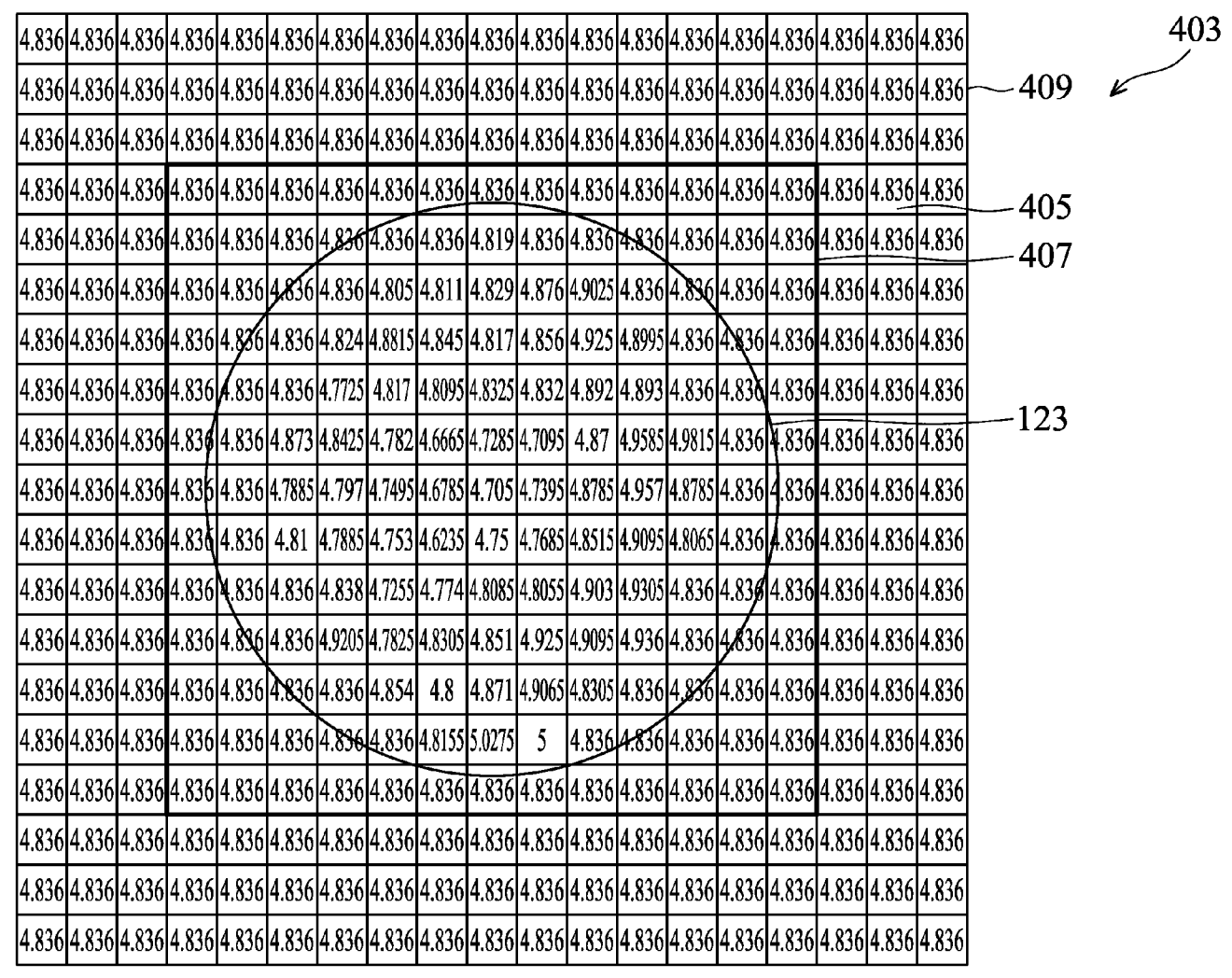

FIG. 4 illustrates step 303, in which the wafer 123 may be prepared for implantation by initially separating the wafer 123 into a grid 403. The grid 403 is a simple way of breaking the wafer into individual cells 405, wherein each of the individual cells 405 can be handled separately during the actual implantation (discussed further below with respect to FIGS. 5A-5B). As illustrated, the grid 403 may have an inner grid 407 which includes a square grid around the wafer 123 and an outer grid 409 which may be formed to extend beyond the actual wafer 123 in order to account for the movement of the coherent ion beam 121 as it enters into the wafer 123 and completely clears off of the wafer 123. Additionally, while the grid 403 in FIG. 4 is shown as having straight lines for the sake of simplicity, one of ordinary skill in the art will recognize that dimensions of the grid 403 may be slightly curved as illustrated by the curvature of the first track 201 in FIG. 2.

For simplicity, the grid 403 may be formed in a relatively square array, with an equal number of individual cells 405 along both an x-direction and a y-direction. Additionally, each of the individual cells 405 may also be relatively square (with the sides being slightly curved from the motion of, e.g., the first track 201 in FIG. 2), with each individual side having a distance similar to the height $h_1$ of the coherent ion beam 121 (see FIG. 2). For example, for a coherent ion beam 121 having a height $h_1$ of about 100 mm, each of the individual cells 405 may have a side of about 100 mm. As such, the grid 403 may have between 3 and 30 individual cells 405 per side, such as 20 individual cells 405.

However, as one of ordinary skill in the art will recognize, while the grid 403 itself and each of the individual cells 405 may be relatively square, the present embodiment is not limited as such, and the grid 403 may have other shapes, such as a rectangular shape, as desired in order to separate the wafer 123 into separate individual cells 405. Further, the individual cells 405 themselves do not all have to have identical shapes, and different individual cells 405 may have different sizes or shapes from each other. All of these modifications to the simple square example presented in FIG. 4 may alternatively be utilized, and are fully intended to be included within the scope of the current embodiment.

FIG. 4 also illustrates that, once the wafer 123 has been divided into the grid 403 with individual cells 405, each of the individual cells 405 may be matched with a number (illustrated by the arbitrary unit number values within each of the individual cells 405 in FIG. 4) representing an underlying electrical characteristic, such as resistance (in units of Ohm and its multiples whereof), leakage currents (in units of amperes and its multiples whereof), dosages, or other suitable electrical characteristic. These arbitrary unit number values may represent the results of test measurements for a previously formed similar wafer (e.g., a wafer formed with a similar topology as the wafer 123 to be implanted but whose implantation has not been corrected for topography, not shown).

Such testing may include, e.g., a wafer acceptance test (WAT) or circuit probing (CP) test of the previously formed similar wafer for feedback control purposes. Alternatively, the test measurements may result from inline measurements prior to an implantation of critical dimensions of a wafer 123 currently being manufactured for feed-forward control of dosage adjustments as preventive measures. By determining the results of the test measurements, an uncorrected map of numbers within the grid 403 may be created as shown in FIG. 4. As illustrated, the uncorrected map shows the non-uniformity in underlying electrical characteristics in different sections of the wafer 123 caused by the three-dimensional topography that has yet to be corrected.

From this uncorrected map, desired changes to the electrical characteristics of each of the individual cells 405 may be determined in order to obtain a more uniform functionality within the previously formed similar wafer by increasing or decreasing the level of implantation. Once the underlying electrical characteristics (e.g., resistance) have been determined and mapped into the grid 403, the underlying electrical characteristics may be transformed into a dopant adjustment using, e.g., a conversion number. Such a conversion number would take the desired changes to the underlying electrical characteristic within each individual cell 405 and translate it into a desired dopant concentration.

For example, a suitable WAT may include isolation tests, junction leakage tests, resistance measurements, threshold voltage measurement of complementary metal oxide semiconductor (CMOS) integrated circuits, tests for saturated drain current of individual CMOS devices, tests to determine the mobility of the electrons in individual devices, combinations of these, and the like. These tests, and specifically a test such as threshold voltage, may then be used to empirically determine an underlying electrical characteristic in different regions of the previously formed similar wafer as the previously formed similar wafer has progressed through the initial implantation process without correction for the three dimensional topography of the wafer itself.

By way of example only (as this method is dependent upon the individual wafers to be measured and implanted), a WAT performed on a previous formed similar wafer may determine that a first region of the previously formed similar wafer has a higher resistance than an adjacent second region because of the topography of the previously formed similar wafer, such as the first region having a resistance of 4.7585 Ohms and the adjacent second region having a resistance of about 4.75 Ohms. Because it would be beneficial to have a uniform resistance, the method may translate these resistances into dopant concentrations using a conversion number (e.g., a conversion number of $1 \times 10^{12}$ ions/cm²/mΩ), and then assign the individual cell 405 corresponding to the first region a lower dosage of between about $0.1 \times 10^{15}$ ions/cm² and about $1 \times 10^{15}$ ions/cm², such as about $0.4 \times 10^{15}$ ions/cm². Additionally, the method may assign the individual cell 405 corresponding to the second region a higher dosage of between about $0.1 \times 10^{15}$ ions/cm² and about $1 \times 10^{15}$ ions/cm², such as about $0.5 \times 10^{15}$ ions/cm². By adjusting these dopants concentrations, the variation from the topography may be reduced.

Optionally, if there are any of the individual cells 405 in which the WAT or other test does not provide satisfactory data for an adequate determination for a dosage concentration, the dosages of these individual cells 405 may be estimated. One type of estimation that may be used in an embodiment would be to calculate an overall mean dose value for those individual cells 405 of the wafer 123 which did provide satisfactory data and then assign the overall mean dose value to those individual cells 405 that did not provide satisfactory data. However, while the use of an overall mean dose value method has been described, it is not meant to be limiting, and any other suitable estimation technique may alternatively be used to estimate an appropriate dopant concentration.

In step 305, the desired dosage concentrations of each of the individual cells 405 may be decomposed into directional components that correspond to the directions which the ion implanter 100 may utilize in the actual implantation. For example, if the ion implanter 100 utilizes two directions, such as the x-direction and y-direction described above with respect to FIGS. 1-2, the desired dosage concentrations may be decomposed into an x-direction component and a y-direction component. However, while the following description utilizes a two-direction system, present embodiments are not meant to be limited to a two-direction system, and any other suitable number of directions may alternatively be utilized.

The decomposition of the desired dosages into directional components may be performed using a matrix calculation as illustrated in Equation 1.

$$\begin{bmatrix} 1 & 0 & \ldots & 0 & 1 & 0 & \ldots & 0 \\ 1 & 0 & \ldots & 0 & 0 & 1 & \ldots & 0 \\ \vdots & \vdots & \ldots & \vdots & \vdots & \vdots & \ddots & \vdots \\ 1 & 0 & \ldots & 0 & 0 & 0 & \ldots & 1 \\ \vdots & \vdots & \vdots & \vdots & \vdots & \vdots & \vdots & \vdots \\ 0 & \ldots & 0 & 1 & 1 & 0 & \ldots & 0 \\ 0 & \ldots & 0 & 1 & 0 & 1 & \ldots & 0 \\ \vdots & \vdots & \vdots & \vdots & \vdots & \vdots & \ddots & \vdots \\ 0 & \ldots & 0 & 1 & 0 & 0 & \ldots & 1 \end{bmatrix} \cdot \begin{bmatrix} x_1 \\ x_2 \\ \vdots \\ x_n \\ y_1 \\ y_2 \\ \vdots \\ y_n \end{bmatrix} = \begin{bmatrix} z_{11} \\ z_{12} \\ \vdots \\ z_{1n} \\ \vdots \\ z_{n1} \\ z_{n2} \\ \vdots \\ z_{nn} \end{bmatrix} \quad \text{Eq. 1}$$

Where:
n=number of square grids from the dosage map
$x_i$=dose component for grid-i in the x-direction
$y_j$=dose component for grid-j in the y-direction
$z_{ij}$=desired dose in grid (i,j)

Subject to the constraints that: $x_i \geq 0$, $y_j \geq 0$ $\forall i,j \in [1, 2, \ldots, n]$ In this calculation, each row of the first matrix utilizing ones and zeros details the position of the individual cells 405 located within the inner grid 407. For instance, the first illustrated row indicates a one in the first position and a one in the (n+1)-th position, which corresponds to the individual cell 405 located in the first position in the x-direction the first position in the y-direction of the inner grid 407. The next row down still indicates a one in the first position but moves the one from the (n+1)-th position into the (n+2)-th position to calculate the next individual cell 405 of the inner grid 407 in the y-direction. In this fashion, each of the individual cells 405 of the inner grid 407 can be decomposed separately using the same matrix calculation.

However, as one of ordinary skill in the art will recognize, solving an equation such as Equation 1 will result in a multitude of different and equally valid solutions. Accordingly, an optimization of the decompositions in step 307 may be performed on the solutions in order to determine an optimum solution. For example, the solutions may be optimized in order to minimize equations such that specified in Equation 2 (e.g., the least square error):

$$J = \Sigma_{i,j=1}^{n} (z_{ij} - x_i - y_j)^2 \quad \text{Eq. 2}$$

Once set up, the least square errors for each of the solutions may be calculated and the solution may be optimized to determine which solution of the dosage decompositions is optimum. However, as one of ordinary skill in the art will recognize, a least square error optimization is merely one exemplary method that may be used to optimize the multitude of solutions to the dosage decomposition calculations. Any other suitable method of optimization may alternatively be used to arrive at a desired optimum decomposition.

As an example, if an individual cell 405 has a desired dosage concentration of $0.5 \times 10^{15}$ ions/cm², the directional decomposition may, once determined and optimized, have a x-direction component of between about $0.1 \times 10^{15}$ ions/cm² and about $0.4 \times 10^{15}$ ions/cm², such as about $0.2 \times 10^{15}$ ions/cm². Additionally, the same desired dosage concentration may be determined to have a y-direction component of between about $0.1 \times 10^{15}$ ions/cm² and about $0.4 \times 10^{15}$ ions/cm², such as about $0.3 \times 10^{15}$ ions/cm². However, these solutions are merely exemplary and are not meant to be limiting.

In step 309, a conversion factor $\epsilon$ may be determined or calibrated for converting the x-direction dosage and the y-direction dosage into track velocities. This conversion factor $\epsilon$ is used to translate the decomposed dosages into actual track velocities (see FIG. 2) for each of the individual cells 405 in the grid 403 and may be unique to individual ion implanters 100 that may be used along with this embodiment. The conversion factor $\epsilon$ may be determined using empirical data from test implants and measurements of those test implants into previously formed wafers that have been implanted by the ion implanter 100. As way of example only, the conversion factor $\epsilon$ may have a value of between about $1 \times 10^{-12}$ mA·s·cm²/ions and about $30 \times 10^{-12}$ mA·s·cm²/ions, such as about $15 \times 10^{-12}$ mA·s·cm²/ions.

After the conversion factor $\epsilon$ has been calibrated in step 309, the directional decompositions, such as the x-direction decomposition and y-direction decomposition, may be converted into directional track velocities in step 311. Looking initially at, e.g., the x-direction decompositions, the x-direction dosage may be converted into an x-direction track velocity using, e.g., Equation 3:

$$\begin{bmatrix} l_1 & l_2 & \ldots & l_k & 0 & \ldots & \ldots & \ldots & \ldots & 0 \\ 0 & l_1 & \ldots & l_{k-1} & l_k & 0 & \ldots & \ldots & \ldots & 0 \\ \vdots & \ldots & \ldots & \ldots & \ldots & \ldots & \ldots & \ldots & \ldots & \vdots \\ 0 & \ldots & \ldots & \ldots & \ldots & 0 & l_1 & \ldots & l_{k-1} & l_k \end{bmatrix} \cdot \begin{bmatrix} u_1^{-1} \\ u_2^{-1} \\ \vdots \\ u_k^{-1} \\ \vdots \\ u_m^{-1} \end{bmatrix} = \frac{\varepsilon}{J_0} \cdot \begin{bmatrix} x_1 \\ x_2 \\ \vdots \\ x_n \end{bmatrix} \quad \text{Eq. 3}$$

Where:
$x_i$=dose component for grid-i in the x-direction
$\varepsilon$=the optimized conversion factor
$J_0$=the ion beam current intensity
$u_i$=the velocity for track-i in x-direction
k=number of tracks along the beam height
$l_i$=arc length of trajectory over beam width
m=number of tracks along vertical lift
n=number of square grids from dosage map
Subject to the constraints that: $u_i > 0 \ \forall i \in [1, 2, \ldots, m]$ In Equation 3, the parameters m (the number of tracks along the vertical lift), n (the number of square grids from the dosage map), k (the number of tracks along the beam height), and $l_a$ (the arc length of trajectory over the beam width), are all dependent at least in part upon the specific kinematics of the ion-beam scanning trajectory as determined in step 301 (described above with respect to FIG. 3). As such, each of these variables may be dependent at least in part on the particular ion implanter 100 being employed to implant the dopants. However, by way of example only, a typical ion implanter may comprise between 10 and 30 tracks along the vertical lift, such as 19 tracks; between 1 and 10 tracks along the beam height (the number of tracks that would illuminate a single point $P_1$), such as 7 tracks; and have an arc length less than about 450 mm, such as about 300 mm. Additionally, the ion-beam current intensity $J_0$ may be less than about 15 mA, such as about 12 mA.

Following the two-dimensional embodiment, the y-direction track velocities may be calculated from the y-direction decompositions in a similar fashion as the x-direction track velocities by using, e.g., Equation 4.

$$\begin{bmatrix} l_1 & l_2 & \ldots & l_k & 0 & \ldots & \ldots & \ldots & \ldots & 0 \\ 0 & l_1 & \ldots & l_{k-1} & l_k & 0 & \ldots & \ldots & \ldots & 0 \\ \vdots & \ldots & \ldots & \ldots & \ldots & \ldots & \ldots & \ldots & \ldots & \vdots \\ 0 & \ldots & \ldots & \ldots & \ldots & 0 & l_1 & \ldots & l_{k-1} & l_k \end{bmatrix} \cdot \begin{bmatrix} v_1^{-1} \\ v_2^{-1} \\ \vdots \\ v_k^{-1} \\ \vdots \\ v_m^{-1} \end{bmatrix} = \frac{\varepsilon}{J_0} \cdot \begin{bmatrix} y_1 \\ y_2 \\ \vdots \\ y_n \end{bmatrix} \quad \text{Eq. 4}$$

Where:
$y_i$=dose component for grid-i in the y-direction
$\varepsilon$=the optimized conversion factor
$J_0$=the ion beam current intensity
$v_j$=the velocity for track-j in y-direction
k=number of tracks along the beam height
$l_i$=arc length of trajectory over beam width
m=number of tracks along vertical lift
n=number of square grids from dosage map
Subject to the constraints that: $v_i > 0 \ \forall i \in [1, 2, \ldots, m]$ Once solutions for the directional track velocities have been determined, the results may again need to be optimized in step 313. In the two-dimensional embodiment, the optimization of each of the x-direction track velocities and the y-direction track velocities may be performed similar to the optimization performed on the dosage decompositions, such as by using a least square error minimization technique. However, any other suitable optimization technique may alternatively be utilized. The example parameters given, coupled with the example x-direction component and example y-direction component, would yield an example x-direction track velocity of less than about 0.3 mm/s, such as about 0.15 mm/s, and a y-direction track velocity of less than about 0.3 mm/s, such as about 0.2 mm/s.

Step 315 takes the optimized directional track velocities and synthesizes them into the ion implanter 100 by inputting the optimized track velocities into the controller 117. In operation, the controller 117 may utilize the directional track velocities as parameters during its control of the wafer handling system 115. This usage allows the controller 117 to dynamically adjust the track velocities as the coherent ion beam 121 moves from one of the individual cells 405 to another of the individual cells 405. By dynamically altering the directional track velocities, the implantation of ions by the ion implanter 100 into the separate individual cells 405 may be controlled to even out variations caused by the topology of the wafer 123 itself.

Figure 5A:
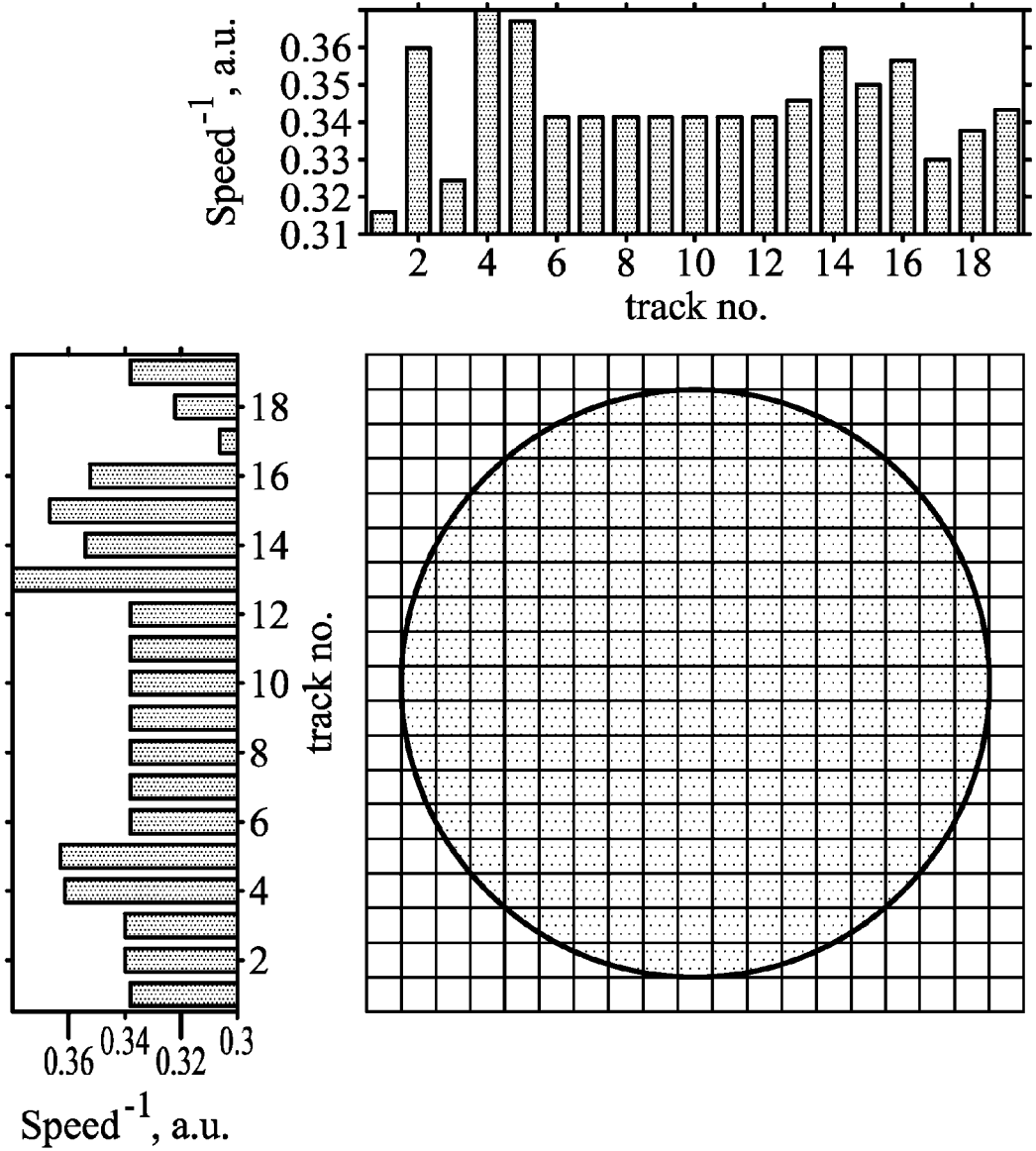

FIGS. 5A-5B illustrate representative directional track velocities and implantations for each track of the implanter for the grid 403 (including both the inner grid 407 and the outer grid 409, see FIG. 4A above) calculated using the above described process. FIG. 5A illustrates the relative changes in normalized dose (or inverse velocity) of each track in relation to the normalized does (or inverse velocity) of the other tracks between the individual cells 405 of the grid 403, as shown by the usage of arbitrary units (a.u.) for the relative inverse speeds. For example, in the horizontal x-direction, track 1 has a much smaller inverse velocity as compared to track 2. As illustrated, by changing the scanning velocity for each track, the implantation doping concentration can be adjusted to correct for topography differences between separate ones of the individual cells 405.

FIG. 5B illustrates the resultant track velocities as determined from sample calculations of Equations (3) and (4), which are also the reciprocals of the inverse velocities illustrated in FIG. 5A. As can be seen, as the velocities of each track increases (e.g., the relative track velocity of v in the y-direction increases from a minimum of about 2.71 in Track-4 to a maximum of about 3.17 in Track-1, or the relative track velocity of u in the x-direction increases from a minimum of about 2.63 in Track-13 to a maximum of 3.27 in Track-17, FIG. 5A), the dopant concentration in each grid-cell decreases to different levels that even out variations due to the topography of the wafer. As such, by way of example only, in an embodiment in which the numbers within FIG. 4 represent a dosage concentration, or a parameter related to the dosage concentration, the concentration of dopants around the wafer 123 may be implanted to have a normalized concentration between about 4.62 and 5.03 as indicated by the desired dosage map of FIG. 4.

However, as one of ordinary skill in the art will recognize, the simple two-pass process described herein (one pass in a first direction, such as the x-direction, and a second pass in a second direction, such as the y-direction) is merely meant to be an exemplary process, and present embodiments should not be limited to a two-pass process. Alternatively, a multiple pass recipe may be utilized as well, where the ion implanter 100 makes multiples passes in the x-direction and multiple passes in the y-direction, with the wafer being rotated between directions. As long as the total dosage remains the same, then making multiple passes is equivalent to reducing the time duration of exposure during each pass and may be accomplished by increasing the scanning velocity accordingly. In such an embodiment, the resultant directional track velocities determined by the method described above with respect to FIG. 3 may be multiplied by the number of passes in each direction. For example, if the ion implanter 100 is programmed to make two passes in the x-direction, the x-direction velocities determined from the above process may be multiplied by two. Alternatively, the directional decompositions, such as the x-direction decomposition and y-direction decomposition may be divided by the number of passes in each direction.

Additionally, the above described method may be implemented using only a single direction, such as either the x-direction or the y-direction in isolation. In such an embodiment the dosage decomposition into an x-direction and a y-direction is foregone, and either Equation 3 or Equation 4 is utilized to calculate track velocities along a single track. However, such an embodiment is limited as such a process can only produce a single track compensation instead of the grid cell compensation that a two-dimension or greater process can achieve.

Figure 6:
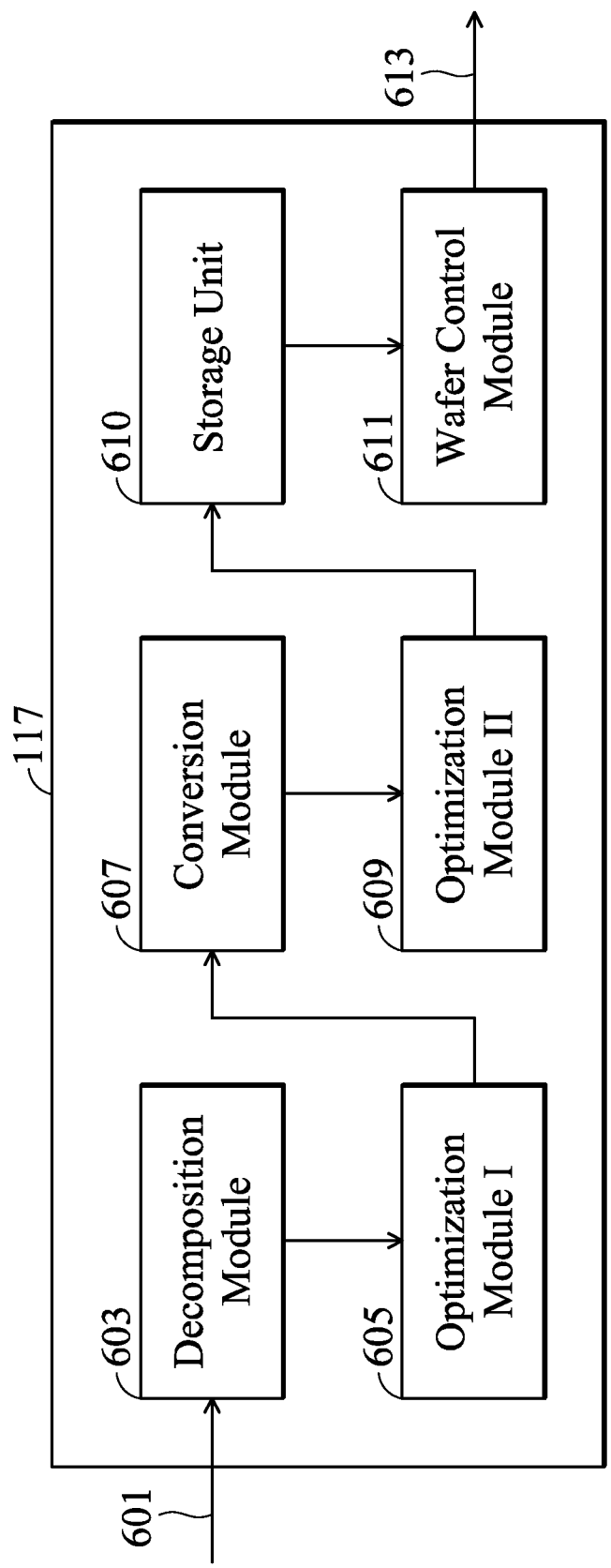
FIG. 6 illustrates an embodiment of a controller of an ion implanter is adapted to determine the track velocities.

FIG. 6 illustrates another embodiment in which the controller 117 (see FIG. 1) of the ion implanter 100 is configured and adapted to determine the track velocities from the desired dosages. In this embodiment the desired dosages for each of the individual cells 405 are input into the controller 117 at a first input port 601. The desired dosages may be stored in memory until they are input into a decomposition module 603. The decomposition module 603 is adapted or configured using either software or hardware to decompose the individual dosages into the directional components, such as the x-direction components and y-direction components as described above with respect to Equation 1.

Once decomposed, the output of the decomposition module 603 may be input (either directly or through a storage medium) into a first optimization module 605. The first optimization module 605 is adapted or configured to optimize the x-direction components and y-direction components in order to determine an optimum solution. For example, the first optimization module 605 may use a least square error minimization process (such as the one described above with respect to Equation 2) to find an optimum x-direction component and an optimum y-direction component.

The output from the first optimization module 605 is routed to the input of a conversion module 607. The conversion module 607 receives the optimized directional components and, using a conversion factor method such as the one described above with respect to Equations 3 and 4, converts the directional components into directional track velocities, such as the x-direction track velocities and the y-direction track velocities. Once converted, the directional track velocities may be output from the conversion module 607 to the second optimization module 609.

The second optimization module 609 receives the directional velocities, such as the x-direction track velocities and the y-direction track velocities, from the conversion module 607 and optimizes the directional velocities to determine an optimized solution for the directional velocities in a manner similar to the one described above with respect to step 313. The second optimization module 609 may output the optimized directional velocities to a storage unit 610, from which a wafer control module 611 may pull in order to control the positioning and movement of the wafer 123. Finally, the wafer control module 611 outputs signals through output port 613 to the wafer positioning control system 115, which controls the position and velocity of the wafer 123 during the ion implantation process.

However, as one of ordinary skill in the art will recognize, inputting the final track velocities into the ion implanter 100 or, alternatively, inputting the desired dosages into the ion implanter 100 are not the only methods through which data may be input into the ion implanter 100. Any combination of the above described method steps may be performed within the ion implanter 100 or outside of the ion implanter 100. All of these combinations are fully meant to be included within the present embodiments.

Although the present embodiments and their advantages have been described in detail, it should be understood that various changes, substitutions and alterations can be made herein without departing from the spirit and scope of the embodiments as defined by the appended claims. For example, the number of tracks utilized, the particular optimization routine performed, or the number of directions chosen can all be modified without leaving the scope of the present embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A method for manufacturing semiconductor devices, the method comprising:
providing a semiconductor wafer;
separating the semiconductor wafer into at least a first cell and a second cell;
assigning the first cell a first dosage and assigning the second cell a second dosage;
decomposing the first dosage into a first dimension component and a second dimension component;
decomposing the second dosage into a third dimension component and a fourth dimension component;
converting the first dimension component into a first velocity, converting the second dimension component into a second velocity, converting the third dimension component into a third velocity, and converting the fourth dimension component into a fourth velocity;
implanting dopants into the first cell using the first velocity and the second velocity, the implanting dopants being performed with an ion implanter; and
implanting dopants into the second cell using the third velocity and the fourth velocity, the implanting dopants being performed with the ion implanter.

2. The method of claim 1, further comprising optimizing the first dimension component and the second dimension component after the decomposing the first dosage.

3. The method of claim 2, wherein the optimizing the first dimension component and the second dimension component is performed by minimizing the least square errors.

4. The method of claim 1, wherein the converting the first dimension component, the converting the second dimension component, the converting the third dimension component, and the converting the fourth dimension component are performed using a dosage to speed conversion factor.

5. The method of claim 4, wherein the dosage to speed conversion factor is determined empirically.

6. The method of claim 1, wherein the assigning the first cell the first dosage further comprises performing a wafer acceptance test or an inline measurement.

7. The method of claim 1, wherein the first velocity is divided by a number of passes made by the ion implanter along a first direction.

8. A method for implanting dopants comprising:
providing a substrate;
separating the substrate into a plurality of cells;
determining a dosage for each one of the plurality of cells;
decomposing the dosage for each one of the plurality of cells into directional components;
translating the directional components into directional velocities for each one of the plurality of cells, the translating the directional components using at least one conversion factor;
applying the directional velocities to a substrate control system; and
implanting ions into the plurality of cells as the substrate and an ion beam move relative to each other at the directional velocities for each respective cell into which the ion beam is implanting ions.

9. The method of claim 8, further comprising performing an optimization of the directional components.

10. The method of claim 9, wherein the optimization is performed at least in part through a minimization of the least squares error.

11. The method of claim 8, further comprising determining the at least one conversion factor empirically.

12. The method of claim 8, wherein the determining the dosage for each cell further comprises performing a wafer acceptance test or an inline measurement.

13. The method of claim 8, wherein the directional velocities include a first velocity along a first direction and a second velocity along a second direction perpendicular to the first direction.

14. The method of claim 8, wherein the ion beam is fixed and the wafer moves relative to the ion beam.

15. The method of claim 8, wherein the wafer remains fixed and the ion beam is moved relative to the wafer.

16. The method of claim 8, further comprising optimizing the directional velocities.

* * * * *